United States Patent [19]

Skare et al.

[11] 4,143,931

[45] Mar. 13, 1979

[54] FLEXIBLE CONDUCTOR STRIPS FOR MINIATURIZED ELECTRICAL SYSTEMS

[75] Inventors: Vern E. Skare, Marion, Iowa; Dana D. Sokol, Rochester, Minn.

[73] Assignee: Cir-Kit Concepts, Inc., Rochester, Minn.

[21] Appl. No.: 763,670

[22] Filed: Jan. 28, 1977

[51] Int. Cl.² .................. H05K 1/08; H05K 1/14; F21V 33/00; H01B 11/02
[52] U.S. Cl. ................... 339/17 F; 174/117 A; 174/117 FF; 362/145; 362/234
[58] Field of Search ............ 362/145, 151, 152, 227, 362/234, 249; 339/17 F; 174/117 F, 117 A, 117 FF

[56] References Cited

U.S. PATENT DOCUMENTS

| | | | |
|---|---|---|---|
| 2,749,382 | 6/1956 | Lockard | 339/17 F |
| 2,994,059 | 7/1961 | Dahlgren et al. | 339/17 F X |
| 3,495,352 | 2/1970 | Sbare | 362/152 X |
| 3,500,289 | 3/1970 | Herb | 339/17 F |
| 3,524,921 | 8/1970 | Wolf | 339/17 F X |
| 3,763,307 | 10/1973 | Wolf | 339/17 F X |
| 3,894,225 | 7/1975 | Chao | 362/249 |
| 4,054,348 | 10/1977 | Stroupe et al. | 339/17 F X |

FOREIGN PATENT DOCUMENTS 2409311  12/1974  Fed. Rep. of Germany ........ 339/99 R

*Primary Examiner*—Fred L. Braun
*Attorney, Agent, or Firm*—Snyder, Brown & Ramik

[57] ABSTRACT

A miniaturized electrical system comprises a number of electrical devices interconnected by conductive tape. The electrical devices and metal foil conductors are electrically connected in the system directly or indirectly to the metal foil conductors of the conductive tape and the entire system may be adhesively secured to the surfaces of a miniature device such as a doll house with the metal foil conductors fully covered and protected and adapted to be painted over so as not to be discernible. Brads are used to penetrate the conductive foils either to enhance the electrical connection between directly contacted foils or to establish electrical connection between foils separated by an adhesive strip. The kit of electrical devices and conductive tape features a miniaturized wall outlet which is physically secured to and electrically connected with the conductive tape by brads.

3 Claims, 11 Drawing Figures

U.S. Patent  Mar. 13, 1979  Sheet 4 of 4  4,143,931
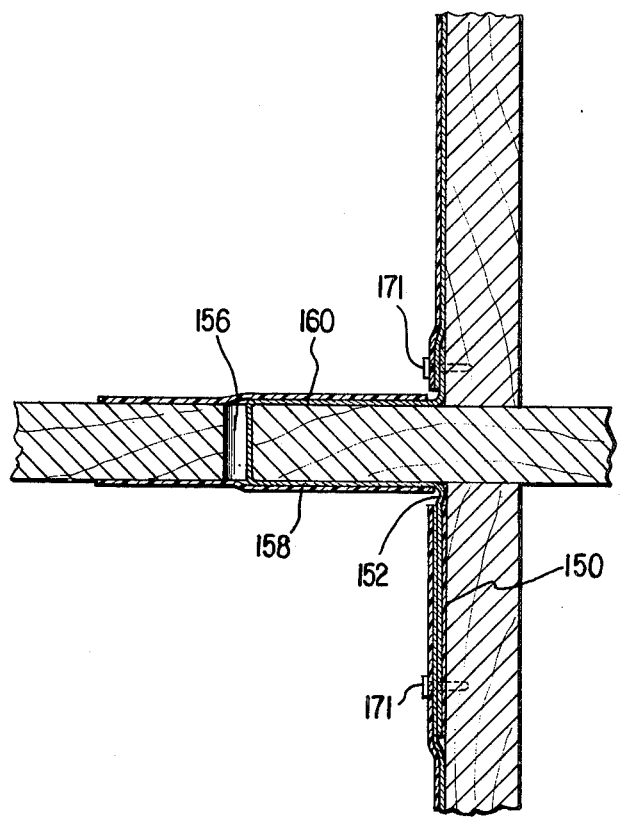
FIG. 9
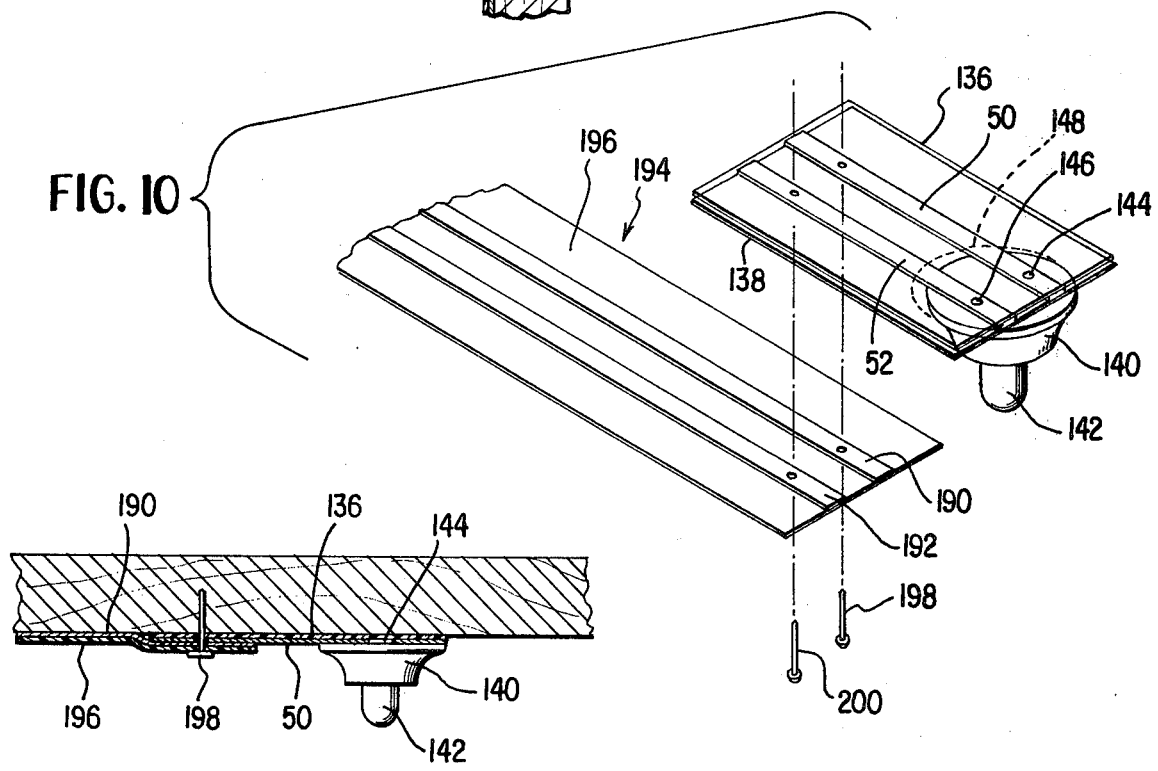
FIG. 10
FIG. 11

FLEXIBLE CONDUCTOR STRIPS FOR MINIATURIZED ELECTRICAL SYSTEMS

BACKGROUND OF THE INVENTION

This invention is directed to miniaturized electrical systems and particularly that type of system to be employed in doll houses or the like and otherwise to provide a realistic and life-like electrical system.

Miniaturized electrical systems are becoming increasingly more popular and although they can be constructed from commercially available products, it is difficult to conceal the wires and in general to provide a neat and effective installation.

BRIEF SUMMARY OF THE INVENTION

Accordingly, it is of primary concern in connection with this invention to provide a kit which may be utilized to install miniaturized electrical systems in neat and efficient fashion and wherein the electrical connections are easily hidden from view so as most effectively to simulate a real life installation and otherwise to simplify the installation procedure.

Basically, the present invention contemplates miniaturized electrical systems employing electrically conductive tape in the form of flexible adhesive strip having a pair of spaced, parallel metal foil conductors adhesively secured thereon so that the adhesive strip may be applied against a supporting surface or surfaces with the metal foil conductors fully covered. The adhesive strip can later be painted over to mask or hide the conductor assembly. Straight runs of the tape are employed and where change of direction is required, the ends of two straight runs are overlapped. Although portions of the underlying adhesive strip could be cut away to allow the conductors of the two runs to contact each other directly, a brad driven through both runs effectively connects the overlapped but separated conductors. This is one feature of this invention.

In association with such electrically conductive tape, one or a number of electrical devices may be utilized some of which are characterized by the use of a length of adhesive strip provided with adhesive on both sides thereof, one side of which adhesively carries metal foil conductors and the other side of which may be engaged against the supporting surface with the metal conductors of the electrical device overlapped by and in direct contact by the electrical conductors of the conductive tape.

The invention also further features a miniaturized wall socket or outlet device which is adapted to cooperate with the conductive tape and has securing means which simultaneously secures same in place and effects electrical connection with the metal foil conductors of the conductive tape.

BRIEF DESCRIPTION OF THE DRAWING FIGURES

FIG. 9 is a sectional view showing the manner of making a through splice and indicating the through splice assembly therein;

FIG. 10 is an exploded perspective showing a miniaturized ceiling wall fixture according to the present invention; and FIG. 11 is a sectional view showing the assembly of FIG. 10 in place.

DETAILED DESCRIPTION OF THE INVENTION

Figure 1:
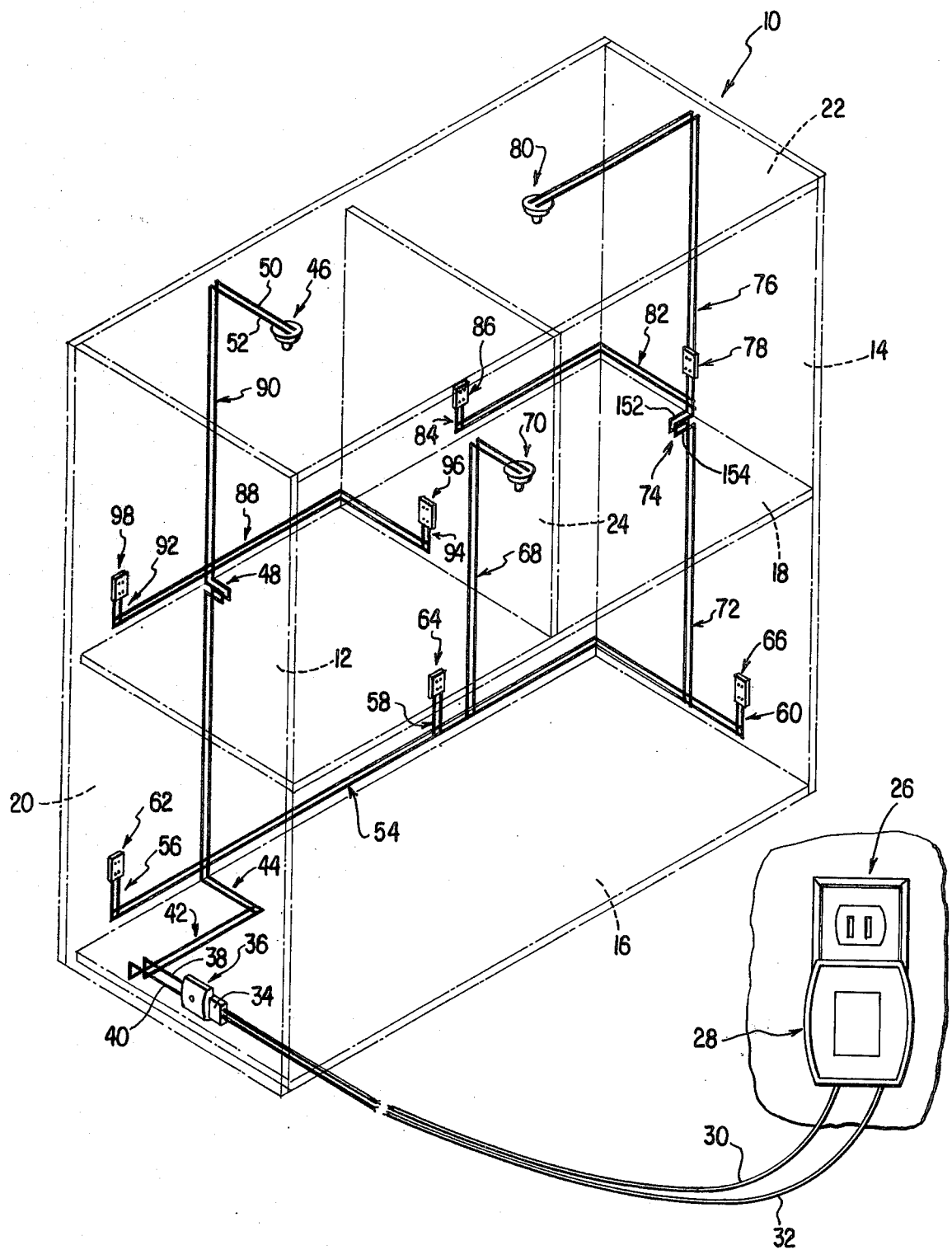
FIG. 1 is a perspective view diagrammatically illustrating an electrical system according to the present invention.

Referring at this time more particularly to FIG. 1, a typical miniaturized electrical system according to the present invention is depicted therein.

As shown in phantom lines in FIG. 1, a typical structure such as a doll house 10 may be provided with the electrical system according to this invention. The doll house structure may include the opposite side wall portions 12 and 14, the floor portion 16, the first floor ceiling panel 18 which also provides the floor for the second floor of the structure, the back wall structure 20 and the second floor ceiling panel 22, substantially as is shown. The second floor is also shown divided into two rooms by the divider panel 24. It is appreciated that other and different structures may be provided, as may be desired.

Also shown in FIG. 1 is a double outlet wall socket indicated generally by the reference character 26 into one female socket of which is plugged a transformer assembly indicated generally by the reference character 28 and which has a pair of leads 30, 32 extending therefrom for supplying a 12 volt nominal a.c. voltage to the miniaturized electrical system. Such transformers are commercially available and should require no further description. The leads 30, 32 are provided with a male plug 34 and is plugged into a junction splice subassembly 36 such as that disclosed in the Wolf U.S. Pat. No. 3,763,307 of Oct. 2, 1973, and which is secured to the outer side of the side wall 20 and has metal foil conductor leads 38 and 40 which are projected through suitable openings in the panel 20 into the interior of the first floor space of the structure as shown.

In a manner hereinafter particularly described, the ends of the leads 38, 40 are connected by a suitable conductive strip run 42 and a crossing conductive strip run 44 ultimately to the miniaturized ceiling fixture device indicated generally by the reference character 46. Where the conductors pass through the panel 18, a through splice assembly 48 is utilized, as hereinafter more particularly described and it will be appreciated that the ceiling fixture 46 includes metal foil conductors 50, 52 which are electrically connected to an end of the conductive tape extending thereto, also as hereinafter more particularly described.

The conductive tape run 54 crosses the run 44 on the back wall 20 as is shown and is electrically connected thereto as hereinafter described and is provided with short runs 56, 58 and 60 to which the miniaturized wall outlets 62, 64 and 66 are electrically connected, as hereinafter described. The run 54 is also connected to the run 68 which extends to a further ceiling fixture 70 and a further run 72 connects with the run 54 as shown and, through the intermediary of a through splice indicated generally by the reference character 74, connects with a run 76 on which a further wall outlet 78 is provided and which extends to a further miniaturized ceiling fixture 80, as shown. Further, in the specific arrangement shown, the run 76 is electrically connected with a further run 82 and through a short run 84 to a wall outlet assembly 86 and, lastly, the run 88 is electrically connected with the run 90 and through the short runs 92 and 94 to the further outlets 96 and 98.

Referring at this time more particularly to FIGS. 1-4, details of installing one of the components of the kit is shown therein. The component depicted is the junction splice 36 illustrated in FIG. 1 and consists of a female socket assembly and a conductive lead assembly integrated therewith.

Figure 2:
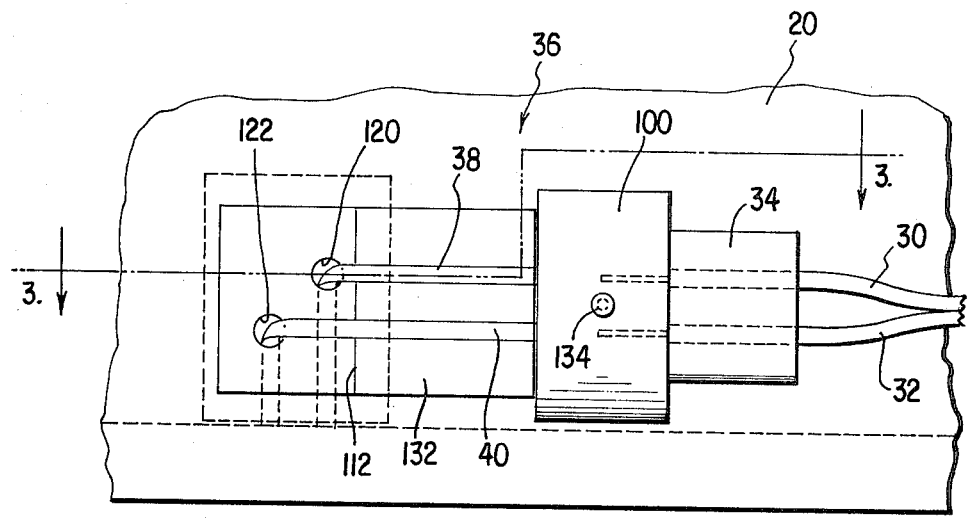
FIG. 2 is an enlarged view illustrating a junction splice according to the present invention.
Figure 3:
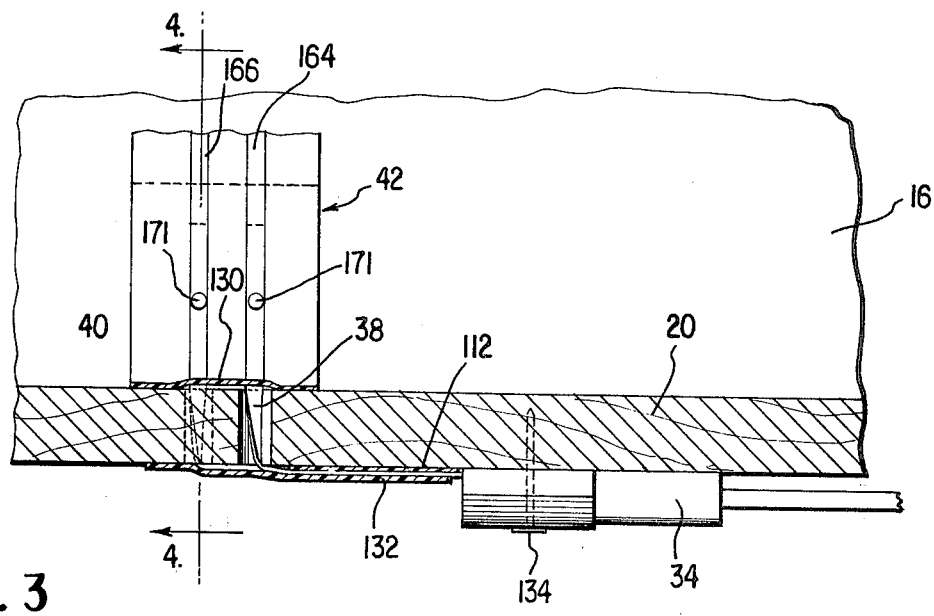
FIG. 3 is a sectional view taken substantially along the plane of section line 3—3 in FIG. 2 and showing further details of the junction splice.
Figure 4:
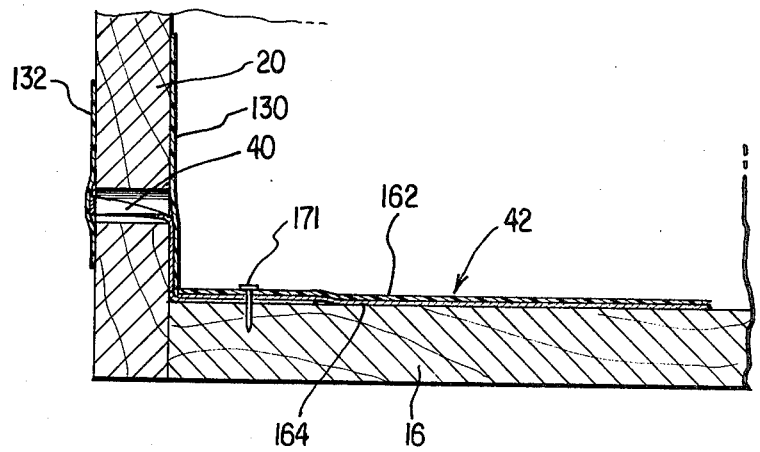
FIG. 4 is a sectional view taken along the plane of section line 4—4 in FIG. 3 showing again further details of the junction splice.

Initially, the inner protective sheet for the adhesive strip 112 of the body 100 is peeled away back to the body 100 and torn off so that the adhesive strip 112 may be applied to the outer side of the panel 20 as shown in FIG. 1 and also in FIGS. 2-4. The wall 20 is provided with a pair of openings 120 and 122 through which the metal foil conductors 38 and 40 are projected, as illustrated and whereas this through connection may be made by cutting away a part of the double adhesive strip 112 thus exposing the ends of the conductors 38 and 40, the connection may also be made by means of a through splice hereinafter described in conjunction with FIG. 9. In any event, the metal foil conductors 38 and 40 are engaged against the inner surface of the wall or panel 20 and along the floor 16 as shown in FIG. 4 and firmly held in place at their free ends by a strip 130 of Scotch brand transparent tape. Similarly, after the outer protective sheet is peeled away from the double sided adhesive strip 112, a strip of Scotch brand tape may be applied as indicated at 132 in FIGS. 2-4. The body 100 may be secured in place as by means of a suitable adhesive or, by a suitable brad or nail 134, as illustrated.

Each of the ceiling fixtures includes a flexible strip 136 having adhesive on both sides and initially provided with protective paper or peel away strips on either side; one of which is indicated at 138 in FIG. 10. The ceiling fixture includes a base 140 made of insulating material and which affixes a bulb 142 therein, the opposite ends of the filament of the bulb 142 having connections as at 144 and 146 which are soldered or otherwise suitably connected to the two strips 50 and 52. After the peel away strip or protective layer which is coextensive with the area of the double sided adhesive 136 is peeled away, the lamp may be adhered in the proper position and then the protective strip 138 may be peeled away to expose the two metal foil conductors 50 and 52. For this purpose, it will be appreciated that the strip 138 is cut away around the base of the lamp 140 as indicated by the dashed line 148 in FIG. 10.

Another electrical device according to the present invention are the through splices indicated at 48 and 74 in FIG. 1 and as are shown in more detail in FIG. 9. Each through splice includes a short strip of flexible material having adhesive on both sides, such strip being indicated by the reference character 150 in FIG. 9 and having the spaced, parallel conductors 152 and 154 adhered thereto and extending therefrom, as illustrated. Suitable holes 156 are provided for the two conductors 152 and 154 and they are routed neatly against the surfaces as shown in FIG. 9 and through the respective openings 156. The exposed portions of the conductors 152 and 154 may be covered by suitable strips of Scotch brand transparent tape as indicated at reference characters 158 and 160.

Figure 5:
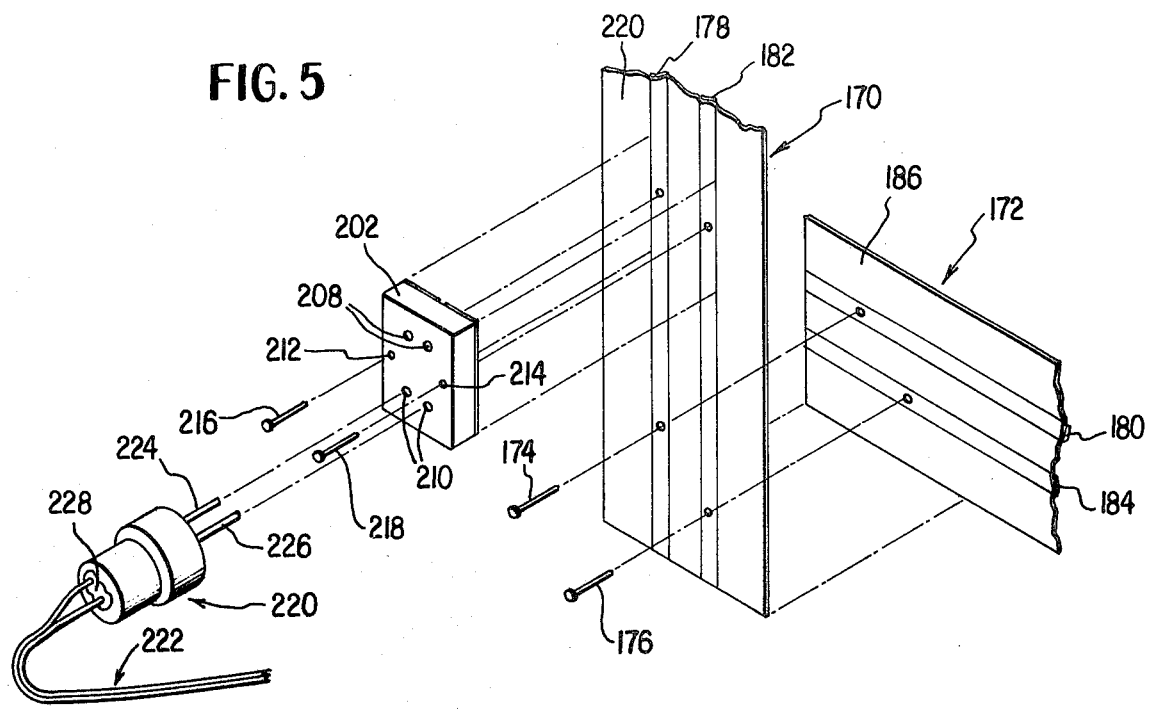
FIG. 5 is an exploded perspective view illustrating certain details of the present invention and including the wall outlet or socket.

After all of the through splices such as those indicated by reference characters 48 and 74, the junction splice as indicated by the reference character 36 and the various ceiling light fixtures as indicated by reference characters 46, 70 and 80 have been positioned and properly oriented within the assembly, the various tape runs are then applied and routed to complete the electrical connections therebetween. Thus, referring to FIG. 4, the conductive tape run indicated by the reference character 42, corresponding to the similar run in FIG. 1, is applied to make electrical connections with the conductors 38 and 40. To this end, the conductive tape incorporates a flexible strip 162 provided with adhesive on one side only and having adhesively secured thereto the metal foil conductors 164 and 166 which, as shown in FIGS. 3 and 4, are overlapped with the ends of the conductors 38 and 40 in electrical contact therewith, with the adhesive strip 162 firmly sandwiching the conductors between such adhesive strip and the underlying surface of the floor 16, as is clearly illustrated in FIG. 4. Where a change of direction such as the right angular change of direction depicted in FIG. 5 is desired between runs such as those indicated by reference characters 170 and 172, they are simply crossed as shown and suitable brads 174 and 176 are driven through the corresponding metal foil conductors 178, 180 and 182, 184 electrically to connect the same. It will be appreciated that in the crossover configuration of the two runs 170 and 172, the various conductors 178-184 are insulated from each other through the intermediary of the adhesive strip 186 and it is therefore the function of the brads 174 and 176 to effect the required and desired electrical connections. When a brad penetrates the metal foil, a "collar" of the foil is formed around the brad which makes good electrical contact therewith completely around the brad. Thus, even though the two metal foils are separated by an insulating strip, the connections between the two "collars" and the brad ensures good electrical connection between the separated strips. Such brads 171 preferably are also utilized even at those regions where direct electrical connection is made between strips, as in FIG. 4, for example, in order to enhance the electrical connection and assure that the adhesive strips do not subsequently tend to peel away from the substrate.

This is also illustrated in FIG. 10 wherein the exposed strips 50 and 52 of the ceiling fixture are overlapped by the corresponding ends of the metal foil conductors 190 and 192 of the run 194 and are held thereagainst by the sandwiching action of the adhesive strips 136 and 196 after the protective layer 138 has been peeled away. In FIG. 10, the two brads 198 and 200 are illustrated nevertheless to assure that the end of the run 194 does not commence peeling away from the ceiling surface. See also FIG. 11.

Lastly, the wall outlets according to this invention are positioned and electrically connected into the system.

Figure 6:
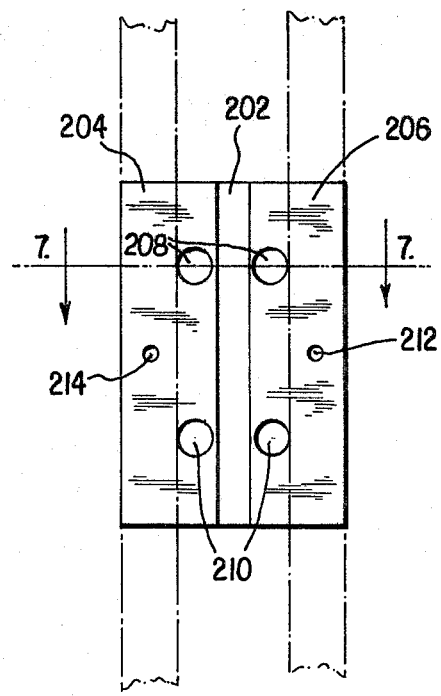
FIG. 6 is a plan view of the electrically conductive side of the wall socket.

Each wall outlet is in the form of a circuit board chip as indicated by the reference character 202 in FIG. 5 and having, on one face thereof, two plated conductor portions 204 and 206 as is illustrated in FIG. 6. The strips 204 and 206 are of widths corresponding to the widths of the metal foil conductors such as those indicated at 178 and 182 in FIG. 5 and are correspondingly spaced apart. Each chip 202 further includes four plated through plug opening holes oriented as the pairs 208 and 210 thereof, Each chip is also provided with two brad-receiving plated through holes 212 and 214, as is illustrated. These plated through holes are in electrical contact with the respective strip portions 204 and 206 as will be appreciated.

Figure 7:
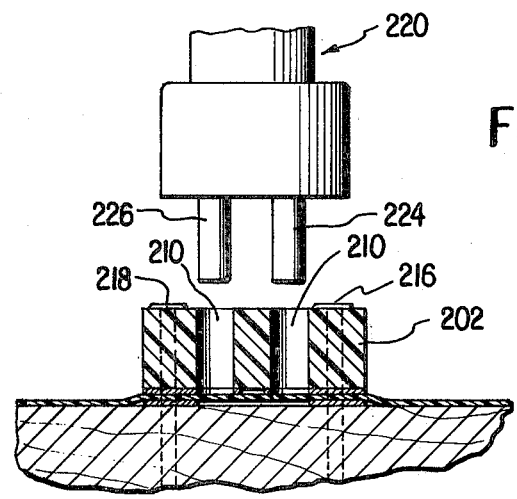
FIG. 7 is a transverse section taken substantially along the plane of section line 7—7 in FIG. 6.

Thus, when the brads 216 and 218 pierce the single sided flexible adhesive strip 220 of the run 170, they will make electrical contact with the conductors 178 and 182 thereof, correspondingly to effect electrical connections to the strips 204 and 206 and the corresponding holes 208 and 210. Also included in the kit of this invention are the plugs indicated generally by the reference character 220 in FIG. 7 which are adapted to receive the bared ends of a pair of wires 222 of an electrical fixture such as a floor lamp or the like, which bared ends make contact with the metal prongs 224 and 226 of the plugs, the wires 222 being held in place by suitable adhesive such as room curable synthetic resinous material as indicated by the reference character 228. The plugs 220 are staple items of commerce and are the bases or sockets of light emitting diodes, the prongs 224 and 226 making electrical connection through the plated through portions of the holes 208 or 210, as will be evident.

Figure 8:
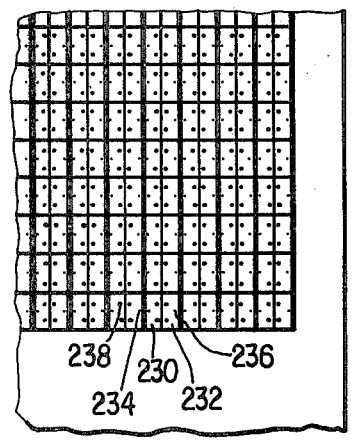
FIG. 8 is a view showing a portion of a negative for forming wall sockets.

FIG. 8 illustrates the fashion in which the wall outlets conveniently can be made. FIG. 8 illustrates a negative pattern which is used to expose the photoresist on one side of a large sheet of circuit board and which photoresist covers the copper plating thereof and is adapted, when exposed to light, to harden so as to be resistent to subsequent solvent removal whereas the unexposed portions are removed by the solvent. The thus exposed copper plating is then etched to remove the exposed copper and thereby form the conductor strip portions 204 and 206. Thus, in FIG. 8, the two areas 230 and 232, for example, ultimately form the strips 204 and 206; the dots 234 and 236 form the pattern openings by means of which the holes 212 and 214 subsequently are located; and the larger dots 238 form the pattern openings by means of which the holes 208 and 210 are located, all of which holes are later plated through as previously discussed. In this way, a large number of accurately formed wall outlet chips may be formed from a single large sheet of printed circuit board.

What is claimed is:

1. In a miniaturized electrical system, a plurality of electrical components each having a strip of double-sided adhesive provided on an outer side thereof with a pair of spaced apart and exposed metal conductor foils, flexible conductor strip means having a single-sided adhesive strip provided with a pair of spaced apart and exposed metal conductor foils adapted to overlap and contact the foils of said electrical components, and at least one wall outlet member comprising a printed circuit board chip having spaced conductor strips on one side thereof and spaced apart similarly to the foils of said conductor strip means, said chip having a plated-through hole associated with each conductor strip thereof, a metal brad for passing through each such hole and a foil of the conductor strip means to make electrical contact therewith, and said chip also having a pair of plug-receiving plated through holes electrically connected with a respective strip.

2. In a miniaturized electrical system, a plurality of straight runs of flexible strip conductor means each having a single-sided adhesive strip adhered to a wall surface and provided with a pair of spaced apart metal conductor foils sandwiched between the adhesive strip and wall surface, the ends of said runs being overlapped with the conductor foils of one run overlying the adhesive strip of an adjacent run, and a pair of brads passing through said runs and into said wall surface, one of said brads penetrating the adhesive strip and a conductor foil of said one run as well as the adhesive strip and a conductor foil of the adjacent run, and the other of said brads penetrating the adhesive strip and the other conductor foil of said one run as well as the adhesive strip and the other conductor foil of the adjacent run, whereby electrically to connect the corresponding metal conductor foils of the runs through the system, said system including a wall outlet member overlying a portion of one of said runs, said outlet member comprising an insulator chip having a pair of spaced conductor strips contacting the adhesive strip of said one of said runs and registered with the conductor foils thereof, said chip having a first pair of plated-through holes and at least a second pair of plated-through holes, the through-platings of one pair of holes being in electrical contact with a respective one of said conductor strips and the through-plating of the other pair of holes being in electrical contact with a respective one of the conductor strips, and a pair of brads received in said first pair of holes and penetrating said one of said runs to complete electrical contact between the conductor strips and the conductor foils, the second pair of holes thereby being available as female connectors in the electrical system.

3. In a miniaturized electrical system including a conductor strip comprising an adhesive backing adhered to a wall surface and a pair of spaced, parallel metal conductor strips sandwiched between the wall surface and said adhesive back, an insulator chip secured to the wall surface in overlying relation to said conductor strip, said chip having an inner surface provided with spaced conductive areas and having a first pair of openings therethrough, each opening being plated through to establish electrical connection with a respective one of said conductive areas, said openings being spaced apart to register with said metal conductor strips, a pair of brads, one of said brads penetrating into said wall surface through one of said plated-through openings and the underlying adhesive backing and one of said conductor strips whereby to establish electrical contact between one of said conductive areas and such one conductor strip, and the other of said brads penetrating into said wall surface through the other of said plated-through openings and the underlying adhesive backing and the other of said conductive strips whereby to establish contact between the other of said conductive areas and the other conductive strip, and a second pair of openings through said chip, said second pair of openings being plated through to establish electrical connection with a respective one of said conductive areas thereby being available as female connectors in the electrical system.

* * * * *